US012704533B2

(12) United States Patent
Sun et al.

(10) Patent No.: US 12,704,533 B2
(45) Date of Patent: Aug. 11, 2026

(54) CIRCUIT, METHOD, AND APPARATUS FOR ACQUIRING RESISTANCE VALUES OF MULTIPLE RESISTORS OF TARGET SYSTEM

(71) Applicant: SANECHIPS TECHNOLOGY CO., LTD., Shenzhen (CN)

(72) Inventors: Niuyi Sun, Shenzhen (CN); Dan Yang, Shenzhen (CN); Na Mei, Shenzhen (CN); Tuobei Sun, Shenzhen (CN)

(73) Assignee: SANECHIPS TECHNOLOGY CO., LTD., Shenzhen (CN)

( * ) Notice: Subject to any disclaimer, the term of this patent is extended or adjusted under 35 U.S.C. 154(b) by 177 days.

(21) Appl. No.: 18/687,909

(22) PCT Filed: Mar. 19, 2022

(86) PCT No.: PCT/CN2022/081856
§ 371 (c)(1),
(2) Date: Feb. 29, 2024

(87) PCT Pub. No.: WO2023/029440
PCT Pub. Date: Mar. 9, 2023

(65) Prior Publication Data

US 2024/0426883 A1 Dec. 26, 2024

(30) Foreign Application Priority Data

Sep. 2, 2021 (CN) ........................ 202111028805.3

(51) Int. Cl.
*G01R 27/08* (2006.01)
*G01R 1/20* (2006.01)
*G01R 31/26* (2020.01)

(52) U.S. Cl.
CPC ............ *G01R 27/08* (2013.01); *G01R 1/203* (2013.01); *G01R 31/2637* (2013.01)

(58) Field of Classification Search
CPC .......... G01R 1/04; G01R 1/203; G01R 27/02; G01R 27/08; G01R 31/26; G01R 31/2637; G01R 31/28
See application file for complete search history.

(56) References Cited

U.S. PATENT DOCUMENTS 1,053,032 A * 2/1913 Harris .................... F01L 7/021 91/335
5,627,101 A * 5/1997 Lin ........................ H01L 22/34 438/18

(Continued)

FOREIGN PATENT DOCUMENTS

CN 202903889 U 4/2013
CN 104267263 A 1/2015

(Continued)

OTHER PUBLICATIONS

International Search Report for corresponding application PCT/CN2022/0811856 filed Mar. 19, 2022 : Mail date Jun. 23, 2022.

*Primary Examiner* — Vinh P Nguyen
(74) *Attorney, Agent, or Firm* — CANTOR COLBURN LLP

(57) ABSTRACT

A circuit for acquiring a resistance value of a resistor includes: a working voltage node resistor Rb, a common ground voltage node resistor Rc, a reference node resistor Ra, a first interconnect parasitic resistor Rwire1, a second interconnect parasitic resistor Rwire2, an encapsulation network resistor Rnet, a first diode Dio_VDD, a Dio_Vss, and a Dio_die, wherein the working voltage node resistor Rb is respectively connected to one end of the Rwire1 and one end of the Rnet. The other end of the Rwire1 is connected to a negative electrode of the Dio_VDD, and a positive electrode of the Dio_VDD is respectively connected to the Ra and a negative electrode of the Dio_Vss. A positive electrode of the Dio_VSS is respectively connected to the Rc and a (Continued)

negative electrode of the Dio_die via the Rwire2. A positive electrode of the Dio_die is connected to the other end of the Rnet.

18 Claims, 8 Drawing Sheets

(56) References Cited

U.S. PATENT DOCUMENTS

| | | | | |
|---|---|---|---|---|
| 6,392,251 | B1 * | 5/2002 | McCarthy | H01L 22/34 257/536 |
| 7,646,213 | B2 * | 1/2010 | Kao | H03K 19/017545 326/30 |
| 8,446,167 | B2 * | 5/2013 | Kao | H04L 25/0278 326/83 |
| 8,471,590 | B2 * | 6/2013 | Kang | G11C 7/1078 327/333 |
| 10,069,495 | B2 * | 9/2018 | Jung | G11C 11/4085 |
| 10,530,324 | B1 | 1/2020 | Huang et al. | |
| 2003/0189436 | A1 * | 10/2003 | Lindolf | G11C 29/02 324/715 |
| 2018/0136268 | A1 * | 5/2018 | Diegmann | G01R 27/14 |
| 2019/0219452 | A1 | 7/2019 | Hayes et al. | |

FOREIGN PATENT DOCUMENTS

| | | | |
|---|---|---|---|
| CN | 105823976 | A | 8/2016 |
| CN | 111914505 | A | 11/2020 |
| CN | 212321726 | U | 1/2021 |

* cited by examiner (c)

Fig. 5

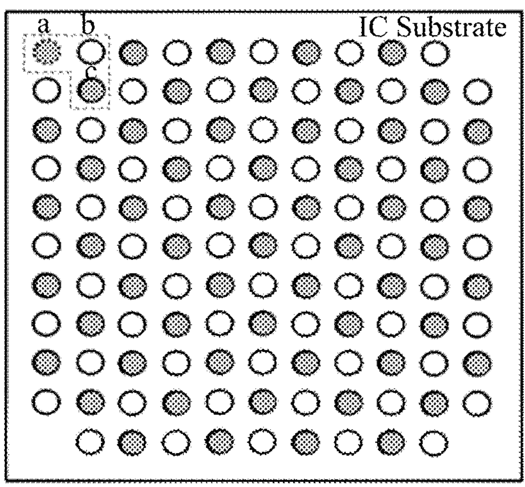

Fig. 6

Determine multiple resistor nodes in an equivalent circuit to be tested, and select any two resistor nodes as a composite resistor node — S602

Apply different voltage polarities to the composite resistor node for voltage and current characteristic detection, and acquire a series resistance value between two ends of the composite resistor node under each voltage polarity combination — S604

Acquire resistance values of the multiple resistors in the equivalent circuit to be tested based on the series resistance value — S606

CIRCUIT, METHOD, AND APPARATUS FOR ACQUIRING RESISTANCE VALUES OF MULTIPLE RESISTORS OF TARGET SYSTEM

CROSS-REFERENCE TO RELATED APPLICATION

This disclosure is a National Stage Filing of the PCT International Application No. PCT/CN2022/081856 filed on Mar. 19, 2022, which claims priority to Chinese patent application No. CN202111028805.3, filed on Sep. 2, 2021 and entitled "CIRCUIT, METHOD, AND APPARATUS FOR ACQUIRING RESISTANCE VALUE OF RESISTOR", the content of which is incorporated herein by reference in its entirety.

TECHNICAL FIELD

The present disclosure relates to the technical field of circuits, and in particular, to a circuit, method, and apparatus for acquiring a resistance value of a resistor.

BACKGROUND

In terms of resistance measurement, resistance values of various resistor components in an encapsulation body need to be precisely tested, and resistance values of different physical compositions on a link also need to be separated technically. Similar requirements and challenges also exist in some larger and more complex systems (such as ultra-large-scale integrated circuits or motor systems). For circuits in which resistors are connected in series or in parallel to each other, and even any complex resistance network (assuming that this complex network is also a two-end network), the observed value of an equivalent resistance that is acquired by measurement will not change when a voltage polarity of a test port is changed, which means that more signals cannot be obtained and the various discrete resistors in the circuit cannot be distinguished, even by changing the measurement methods. Resistors of various components of a target system cannot be separated and extracted in the related technology.

There is currently no effective solution proposed to address the above issue that the resistors of the various components of the target system cannot be separated and extracted.

SUMMARY

Embodiments of the present disclosure provide a circuit, method, and apparatus for acquiring a resistance value of a resistor, which may at least solve the problems in the related technology that resistors of various components of a target system cannot be separated and extracted.

According to an embodiment of the present disclosure, a circuit for acquiring a resistance value of a resistor is provided, the circuit including: a working voltage node resistor Rb, a common ground voltage node resistor Rc, a reference node resistor Ra, a first interconnect parasitic resistor Rwire1, a second interconnect parasitic resistor Rwire2, an encapsulation network resistor Rnet, a first diode Dio_VDD, a second diode Dio_Vss, and a third diode Dio_die, wherein the working voltage node resistor Rb is respectively connected to one end of the first interconnect parasitic resistor Rwire1 and one end of the encapsulation network resistor Rnet; the other end of the first interconnect parasitic resistor Rwire1 is connected to a negative electrode of the first diode Dio_VDD, and a positive electrode of the first diode Dio_VDD is respectively connected to the reference node resistor Ra and a negative electrode of the second diode Dio_Vss; a positive electrode of the second diode Dio_VSS is respectively connected to the common ground voltage node resistor Rc and a negative electrode of the third diode Dio_die via the second interconnect parasitic resistor Rwire2; and a positive electrode of the third diode Dio_die is connected to the other end of the encapsulation network resistor Rnet.

According to an embodiment of the present disclosure, a method for acquiring a resistance value of a resistor, including: determining nodes based on multiple resistors in an equivalent circuit to be tested, and selecting any two nodes as a node combination, wherein the multiple resistors at least include a working voltage node resistor Rb, a common ground voltage node resistor Rc, and a reference node resistor Ra;

- applying different voltage polarities to the node combination for voltage and current characteristic detection, and acquiring a series resistance value between two ends of the node combination under each voltage polarity combination; and
- acquiring resistance values of the multiple resistors in the equivalent circuit to be tested based on the series resistance value.

According to another embodiment of the present disclosure, an apparatus for acquiring a resistance value of a resistor, including:

- a determining unit, configured to determine nodes based on multiple resistors in an equivalent circuit to be tested, and select any two nodes as a node combination, wherein the multiple resistors at least include a working voltage node resistor Rb, a common ground voltage node resistor Rc, and a reference node resistor Ra;
- a first acquisition unit, configured to apply different voltage polarities to the node combination for voltage and current characteristic detection, and acquire a series resistance value between two ends of the node combination under each voltage polarity combination; and
- a second acquisition unit, configured to acquire resistance values of the multiple resistors in the equivalent circuit to be tested based on the series resistance value.

According to still another embodiment of the present disclosure, a computer-readable storage medium is further provided. The above computer-readable storage medium stores a computer program. The computer program is configured to perform, at runtime, the operations in any one of the method embodiments.

According to yet still another embodiment of the present disclosure, an electronic apparatus is further provided, including a memory and/or a processor. The memory stores a computer program. The processor is configured to execute the computer program to perform the operations in any one of the method embodiments.

According to the embodiments of the present disclosure, a circuit for acquiring a resistance value of a resistor includes: a working voltage node resistor Rb, a common ground voltage node resistor Rc, a reference node resistor Ra, a first interconnect parasitic resistor Rwire1, a second interconnect parasitic resistor Rwire2, an encapsulation network resistor Rnet, a first diode Dio_VDD, a second diode Dio_Vss, and a third diode Dio_die, wherein the working voltage node resistor Rb is respectively connected to one end of the first interconnect parasitic resistor Rwire1 and one end of the encapsulation network resistor Rnet. The other end of the first interconnect parasitic resistor Rwire1 is connected to a negative electrode of the first diode Dio_VDD, and a positive electrode of the first diode Dio_VDD is respectively connected to the reference node resistor Ra and a negative electrode of the second diode Dio_Vss. A positive electrode of the second diode Dio_VSS is respectively connected to the common ground voltage node resistor Rc and a negative electrode of the third diode Dio_die via the second interconnect parasitic resistor Rwire2. A positive electrode of the third diode Dio_die is connected to the other end of the encapsulation network resistor Rnet. The technical problem in the related technology that resistors of various components of a target system cannot be separated and extracted is solved, so that effects of separating and extracting the resistors of the various components of the target system and precisely monitoring the resistors of the various components of the system are achieved.

BRIEF DESCRIPTION OF THE DRAWINGS

FIG. 5 is a schematic diagram of arrangement of a ball array and a reference ball for acquisition of a resistance value of a resistor according to the embodiments of the present disclosure;

FIG. 6 is a flowchart of a method for acquiring a resistance value of a resistor according to the embodiments of the present disclosure;

DETAILED DESCRIPTION

The embodiments of the present disclosure will be described in detail below with reference to the accompanying drawings and the embodiments.

It should be noted that the terms "first", "second", etc. in the specification and claims of the present disclosure and the above accompanying drawings are defined to distinguish similar objects, and do not have to be used to describe a specific order or sequence.

Figure 1:
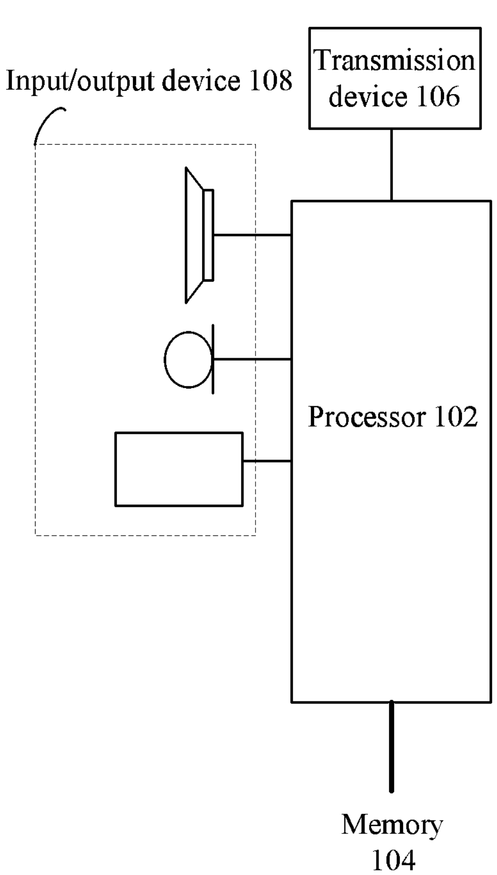
FIG. 1 is a block diagram of a hardware structure of a mobile terminal for implementing a method for acquiring a resistance value of a resistor according to the embodiments of the present disclosure.

The method embodiments in the embodiments of the present disclosure may be executed on a mobile terminal, a computer terminal, or a similar computing device. Taking the running on a mobile terminal as an example, FIG. 1 is a block diagram of a hardware structure of a mobile terminal for implementing a method for acquiring a resistance value of a resistor according to the embodiments of the present disclosure. As shown in FIG. 1, the mobile terminal may include one or more (only one is shown in FIG. 1) processors 102 (which may include but are not limited to a micro processing unit (e.g., Micro-Controller Unit (MCU)), a programmable logic device (e.g., Field Programmable Gate Array (FPGA)), and other processing apparatuses) and memories 104 configured to store data. The mobile terminal may also include a transmission device 106 for a communication function and an input/output device 108. A person having ordinary skill in the art may understand that the structure shown in FIG. 1 is only illustrative, and a limitation will not be made on the structures of the mobile terminal. For example, the mobile terminal may also include more or fewer components than those shown in FIG. 1, or have configurations different from those shown in FIG. 1.

The memory 104 may be configured to store a computer program, such as software programs and modules of application software, such as computer programs corresponding to a hybrid test circuit method in the embodiments of the present disclosure. The processor 102 executes various functional applications and data processing by executing computer programs stored in the memory 104, that is, to implement the above method. The memory 104 may include high-speed random access memory and may also include a non-volatile memory, such as one or more magnetic storage apparatuses, a flash memory, or other non-volatile solid-state memories. In some instances, the memory 104 may further include a memory remotely located with respect to the processor 102. These remote memories may be connected to the mobile terminal through a network. Examples of the above network include, but are not limited to, Internets, intranets, local area networks, mobile communication networks, and combinations thereof.

The transmission device 106 is configured to receive or send data through a network. The specific examples of the above network may include a wireless network provided by a communication provider of the mobile terminal. In one example, the transmission device 106 includes a Network Interface Controller (NIC) that may be connected to other network devices through a base station for communication with the Internet. In one example, the transmission device 106 may be a Radio Frequency (RF) module configured to communicate with the Internet in a radio manner.

Figure 2:
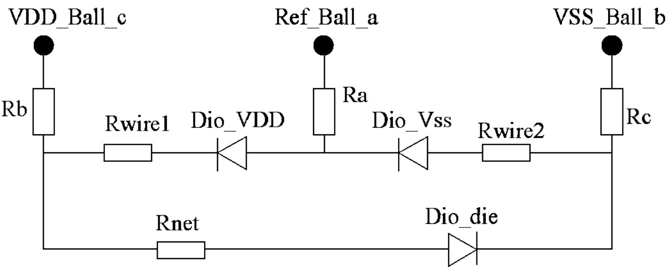
FIG. 2 is a schematic circuit diagram of a circuit for acquiring a resistance value of a resistor according to the embodiments of the present disclosure.

The embodiment of the present disclosure provide a circuit for acquiring a resistance value of a resistor. FIG. 2 is a schematic circuit diagram of a circuit for acquiring a resistance value of a resistor according to the embodiments of the present disclosure. As shown in FIG. 2, the circuit includes: a working voltage node resistor Rb, a common ground voltage node resistor Rc, a reference node resistor Ra, a first interconnect parasitic resistor Rwire1, a second interconnect parasitic resistor Rwire2, an encapsulation network resistor Rnet, a first diode Dio_VDD, a second diode Dio_Vss, and a third diode Dio_die.

The working voltage node resistor Rb is respectively connected to one end of the first interconnect parasitic resistor Rwire1 and one end of the encapsulation network resistor Rnet. The other end of the first interconnect parasitic resistor Rwire1 is connected to a negative electrode of the first diode Dio_VDD, and a positive electrode of the first diode Dio_VDD is respectively connected to the reference node resistor Ra and a negative electrode of the second diode Dio_Vss. A positive electrode of the second diode Dio_VSS is respectively connected to the common ground voltage node resistor Rc and a negative electrode of the third diode Dio_die via the second interconnect parasitic resistor Rwire2. As an exemplary implementation, the positive electrode of the second diode Dio_Vss is connected to one end of the second interconnect parasitic resistor Rwire2, and the other end of the second interconnect parasitic resistor Rwire2 is respectively connected to the common ground voltage node resistor Rc and a negative electrode of the third diode Dio_die. A positive electrode of the third diode Dio_die is connected to the other end of the encapsulation network resistor Rnet.

Figure 3:
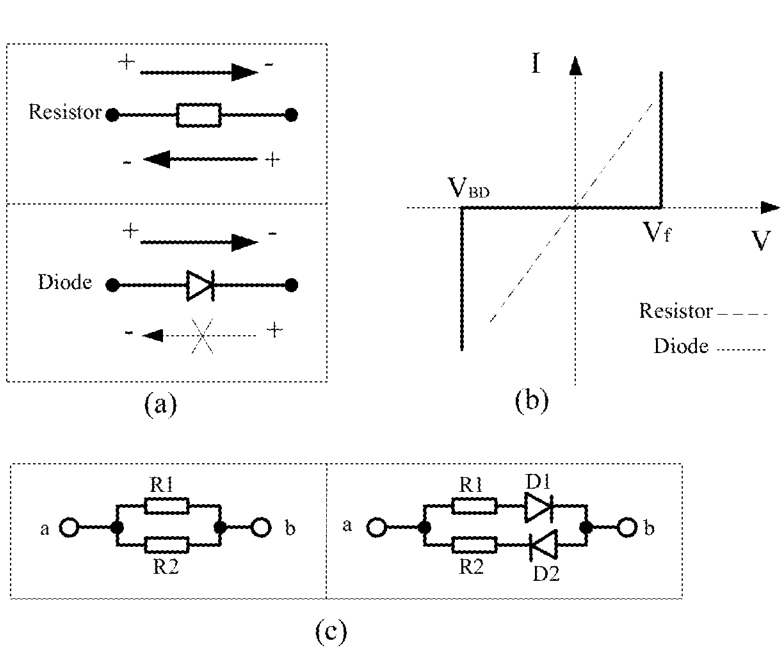
FIG. 3 is a schematic diagram of an IV characteristic difference between a resistor and a diode of a circuit for acquiring a resistance value of a resistor according to the embodiments of the present disclosure.
Figure 4:
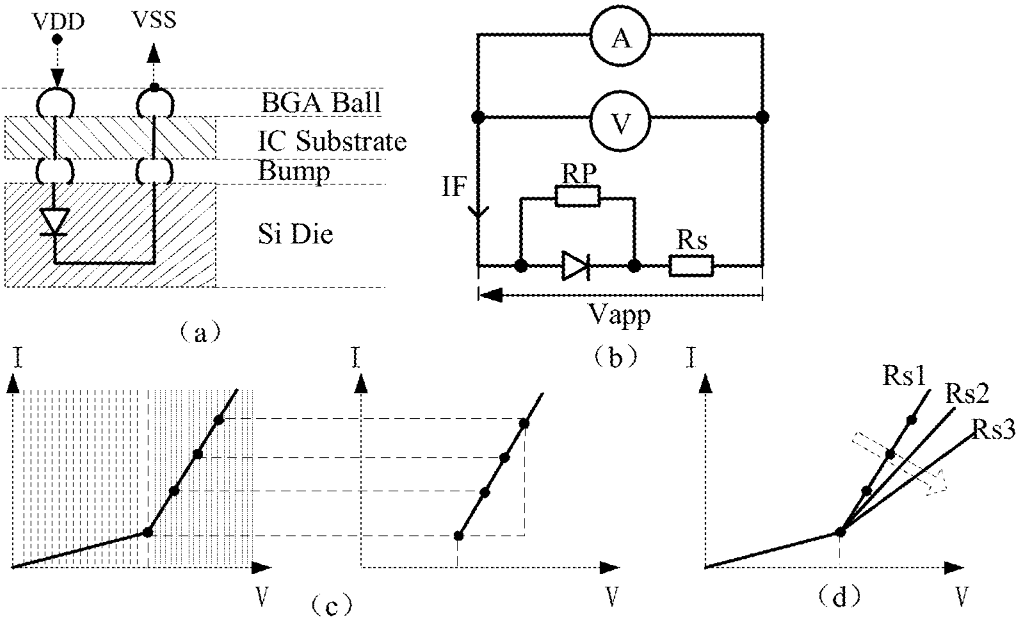
FIG. 4 is a schematic diagram of an equivalent circuit and an IV characteristic difference of a circuit for acquiring a resistance value of a resistor according to the embodiments of the present disclosure.

FIG. 3 is a schematic diagram of an IV characteristic difference between a resistor and a diode of a circuit for acquiring a resistance value of a resistor according to the embodiments of the present disclosure. FIG. 3(*a*) shows a feature of nonpolarity of the resistor and a unidirectional conductivity of the diode. A thickness of the arrow symbol approximately represents the magnitude of a current passing by, and +/− represents a polarity of an external power supply. FIG. 3(*b*) represents an IV curve of an ideal resistor and diode. The dotted line passing through the original point is a typical IV characteristic of the resistor, and the full thick line is an ideal IV characteristic of the diode. VF and VBD respectively represent a forward conduction voltage and a reverse breakdown voltage of the diode. FIG. 3(*c*) shows a change, observed from different ports, in an equivalent resistance of resistors connected in parallel before and after the resistors are connected in series to diodes. The left view shows a resistor parallel circuit when the resistor is not connected to a diode, and the right view shows a resistor parallel circuit when the resistor is connected to a diode in series. If the resistor and the diode are connected in series to each other, FIG. 4 is a schematic diagram of an equivalent circuit and an IV characteristic difference of a circuit for acquiring a resistance value of a resistor according to the embodiments of the present disclosure. As shown in FIG. 4(*a*), a Flip Chip Ball Grid Array (FCBGA) is taken as an example. FIG. 4(*b*) shows a circuit diagram of the basic circuit. RP represents a parasitic parallel resistance of an ideal diode, which is mainly related to the defects in a PN junction process, and RS represents a series resistor.

A simple analysis of FIG. 4(*b*) shows that the IV characteristic curve of the series resistor/diode is modulated by the diode in the series circuit. In case of Vapp<VF, the diode is still in an off state (which is simply considered that the diode is open-circuited). The slope factor of this part of IV curve mainly depends on the magnitude of RP (namely, a RP-dominated region, and it is generally considered that RP>>RS). In case of Vapp>VF, the diode is still in an on state (which is simply considered that the diode is short-circuited, and RP is bypassed). The slope factor of this part of IV curve mainly depends on the magnitude of RS (namely, a RS-dominated region). The slope factor of a linear regression line of data points in this region is 1/RS (as shown in FIG. 4(*c*)), so RS may be extracted by linearly fitting the data points in this region (V, I). In an aging process, as the stress time continues, RS generally shows an increasing trend. As shown in FIG. 4(*d*), shift of the IV characteristic curve of the corresponding resistor/diode series circuit approximately meets the following rule: the slope factor of the curve decreases as the RS increases, and different resistor components in RS in the basic resistor/diode series circuit are not able to be distinguished. FIG. 4(*a*) is taken as an example, equivalent resistors Rball_VDD, Rball_VSS, Rbump, and Rwire are resistors of VDD Ball, VSS Ball, Bump, and all interconnects on the circuit. Obviously, simple analysis of the basic resistor/diode series circuit still cannot solve the problem of achieving distinguishability of the resistors.

In order to solve the above-mentioned technical problems, according to the technical solutions of the embodiments of the present disclosure, the circuit for acquiring the resistance value of the resistor provided in the embodiments of the present disclosure is embedded into a target system, so that separation and extraction of resistors of various components of the system are achieved by testing and analyzing IV characteristics of all end points of the system, and the resistors of the various components of the system may be monitored more precisely. The life of a specific component in the system may be predicted by observing changes in the resistance values in the aging process.

In one or more embodiments, the above working voltage node resistor Rb is a first array resistor composed of multiple resistors connected in parallel to each other.

In one or more embodiments, the above common ground voltage node resistor Rc is a second array resistor composed of multiple resistors connected in parallel to each other.

In one or more embodiments, the working voltage node resistor Rb is connected to one end of the first interconnect parasitic resistor Rwire1 and one end of the encapsulation network resistor Rnet through at least one diode.

In one or more embodiments, the above reference node resistor Ra includes at least one third array resistor, wherein each third array resister is composed of multiple resistors connected in parallel to each other.

In one or more embodiments, the reference node resistor Ra includes multiple third array resistors, and a diode is connected between every two third array resistors.

In one or more embodiments, FIG. 5 is a schematic diagram of arrangement of a ball array and a reference ball for acquisition of a resistance value of a resistor according to the embodiments of the present disclosure. As shown in FIG. 5, the above working voltage node resistor Rb, the common ground voltage node resistor Rc, and the reference node resistor Ra are all bumps on a circuit substrate.

The embodiments of the present disclosure further provide a method for acquiring a resistance value of a resistor. FIG. 6 is a flowchart of the method for acquiring the resistance value of the resistor according to the embodiments of the present disclosure. As shown in FIG. 6, the method includes the following operations S602 to S606.

At operation S602, nodes based on multiple resistors in an equivalent circuit to be tested are determined, and any two nodes as a node combination, wherein the multiple resistors at least include a working voltage node resistor Rb, a common ground voltage node resistor Rc, and a reference node resistor Ra.

At operation S604, different voltage polarities are applied to the node combination for voltage and current characteristic detection, and a series resistance value between two ends of the node combination under each voltage polarity combination is acquired.

At operation S606, resistance values of the multiple resistors in the equivalent circuit to be tested is acquired based on the series resistance value.

Through the above operations, the technical problem in the related technology that resistors of various components of a target system cannot be separated and extracted is solved, so that effects of separating and extracting the resistors of the various components of the target system and precisely monitoring the resistors of the various components of the system are achieved.

In one or more embodiments, the method may further include: when it is detected that all aging reading points of a preset circuit to be tested have not been fully detected, the following operations are performed: an aging test device exerts a stress with a preset duration and a preset strength to a die to be tested; when the preset duration reaches a first threshold or the preset strength reaches a second threshold, the aging test device stops exerting the stress; a measurement unit tests the die to be tested, and calculates resistance values of series resistors; and an expected life value of the die to be tested is determined based on the calculated resistance values of the series resistors.

In an embodiment, as shown in FIG. 3(*b*), the series resistors in the circuit are acquired by measuring the IV characteristics of the resistor/diode series circuit and fitting data of the IV curve part after the diode is turned on. This lays the groundwork for solving the problem of resistance measurement of the resistor/diode hybrid circuit.

The embodiments of the present disclosure provide a circuit for acquiring a resistance value of a resistor, the circuit including the following structures.

A. Physical Structure of a Resistor/Diode Hybrid Test Circuit.

Figure 7:
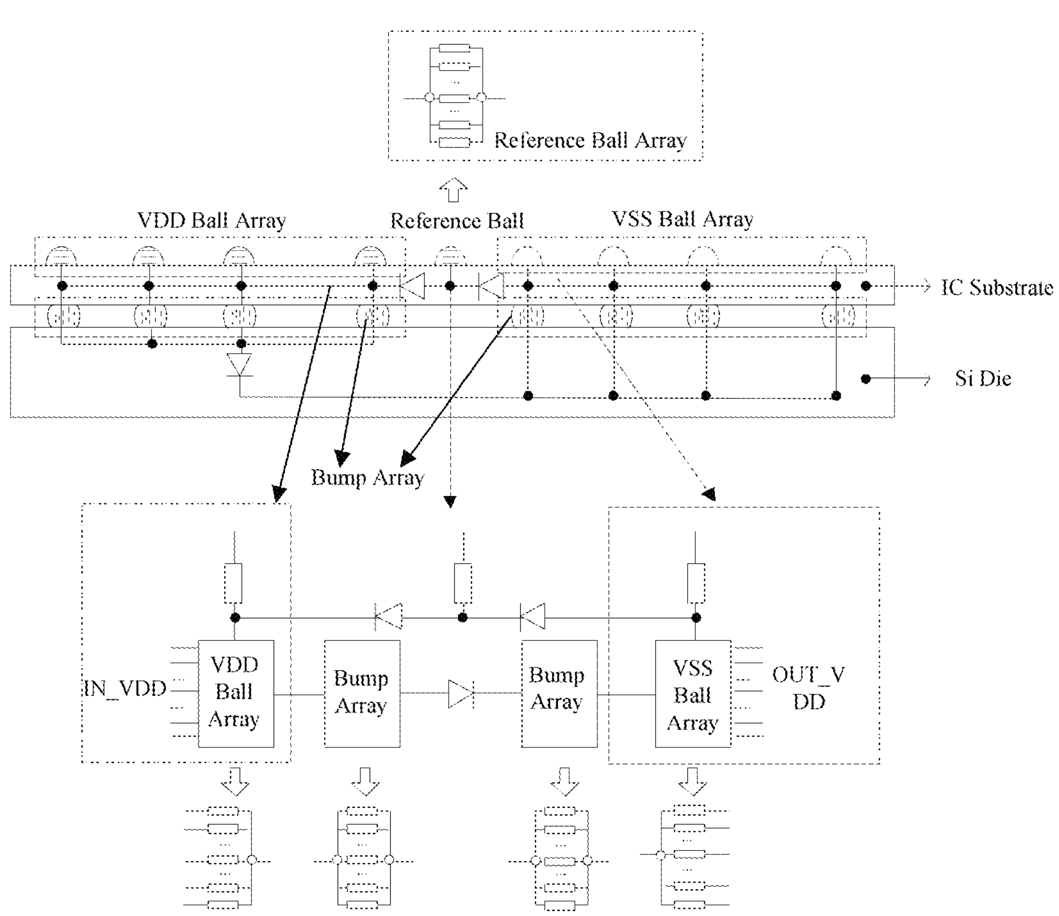
FIG. 7 is a schematic diagram of a physical structure of a circuit for acquiring a resistance value of a resistor and a corresponding topological relationship according to the embodiments of the present disclosure.

FIG. 7 is a schematic diagram of a physical structure of a circuit for acquiring a resistance value of a resistor and a corresponding topological relationship according to the embodiments of the present disclosure. The physical structure of the novel circuit for acquiring the resistance value of the resistor is as shown in FIG. 7. The system may approximately include the following several components:

a. Ball: It is classified into three types: One type is a working voltage ball array (e.g., VDD Ball Array in the figure); one type is a common ground terminal voltage ball array (e.g., VSS Ball Array in the figure); and the other type is a single or multiple reference ball arrays (e.g., Reference Balls in the figure, and the Reference Balls constitute a key part of the entire testing structure), wherein for reliable resistor monitoring, the same type of balls in the VDD Ball Array and the VSS Ball Array will be connected in parallel in an IC Substrate.

b. Bump: It is classified into two parts: One part serves as an intermediate interconnect for connecting a VDD ball to a Si Die, and the other part is an intermediate interconnect for connecting a Si Die to a VSS Ball, both of which are referred to as the Bump Array, wherein parallel connection of Bump Array in the figure is only for illustration and does not limit its specific circuit connection relationship.

c. Diode: There are two types: One type is an integrated diode formed by a diffusion process performed on a Si Die, and the other type is a discrete diode device buried on an IC Substrate or mounted on a surface of an IC Substrate. It should be noted that in reality, there may be multiple parallel diodes between any two VDD Balls and VSS Balls according to the design requirements of encapsulation and a die circuit, but in an actual circuit, these diodes may be abstracted as one equivalent diode.

d. Metal interconnect: The metal interconnect achieves physical connections of the various components in the system and is represented by thin black line in the figures. The interconnect here is for illustration only and does not impose any additional restrictions.

e. Connection relationship: The VDD Ball Array, the VSS Ball Array, and the Bump Array are VDD/VSS ball arrays and Bump arrays respectively, and a, b, and c are markers of the Reference Ball and any balls from the VSS Ball Array and the VDD Ball Array. The Reference Ball and the VDD/VSS Ball Array are connected through two discrete diodes on the IC Substrate, and the two Bump Arrays connected to the VDD/VSS Ball Array are connected through an integrated diode on the Si Die.

B. Topological Structure of the Resistor/Diode Circuit for Acquiring the Resistance Value of the resistor FIG. 7 illustrates the topological structure corresponding to the above physical structure. The most basic physical units such as Ball, Bump, and metal interconnect are abstracted as lumped resistors or resistor networks. The balls a, b, and c correspond to resistors Ra, Rb, and Rc, respectively. The Reference Ball is connected to the discrete diode of the VDD/VSS ball array, which is represented as Dio_VDD and Dio_VSS, and the integrated diode on Si Die is represented as Dio_die.

Before test, one untested VDD/VSS Ball (namely, VDD_Ball_j and VSS_Ball_i) will be selected from each of the VDD Array and the VSS Ball Array. The two untested balls and the Reference Ball form three test ports of an input test circuit, and other Balls are in a floating status (high resistance). By traversing VDD Ball and VSS Ball in the VDD Ball Array and the VSS Ball Array, according to the equivalent circuit shown in FIG. 2, a resistance value of the selected VDD/VSS Ball may be obtained, and then other parasitic resistor parts in the resistor/diode circuit may be obtained.

FIG. 5 shows a schematic diagram of a Ball map, in which, a, b, and c correspond to a Reference Ball, a VSS Ball selected in certain measurement, and a VDD Ball selected in a certain measurement, respectively. The Reference Ball may be arranged at any position (it is recommended that it is arranged at an edge to save a layout area). Meanwhile, the VDD Ball and the VSS Ball on the Ball Map may also distributed at any positions, and their quantities may also be arbitrary, which improves the flexibility and compatibility of the design.

C. Equivalent Circuit of the Resistor/Diode Circuit for Acquiring the Resistance Value of the Resistor If any ball is selected from the VDD/VSS Ball Array and the remaining balls are in the floating status (these floating balls have high resistance values, and may be considered as being open-circuited). As shown in FIG. 7, the physical structure of the system may be further simplified into an equivalent circuit. Ref_Ball_a, VSS_Ball_b, and VDD_Ball_c represents circuit end points of Reference Ball, VSS_Ball_i, and VDD_Ball_j, respectively, and Rnet is a sum including an equivalent resistor including Bump Array on a path between VDD Ball and VSS Ball and a metal conductor resistor between VDD_Ball_c and VSS Ball_b; and Rwire1 and Rwire2 are interconnect resistances between Reference Ball and VDD/VSS Ball.

Figure 8:
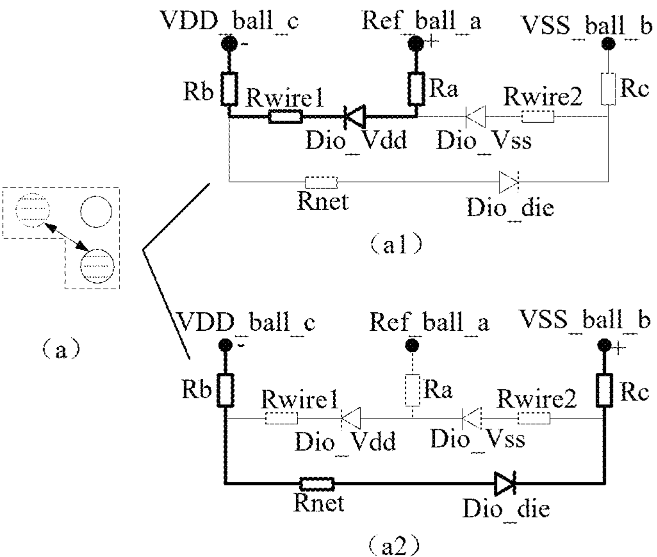
FIG. 8 is an equivalent circuit diagram I of a physical structure of a circuit for acquiring a resistance value of a resistor according to the embodiments of the present disclosure.
Figure 9:
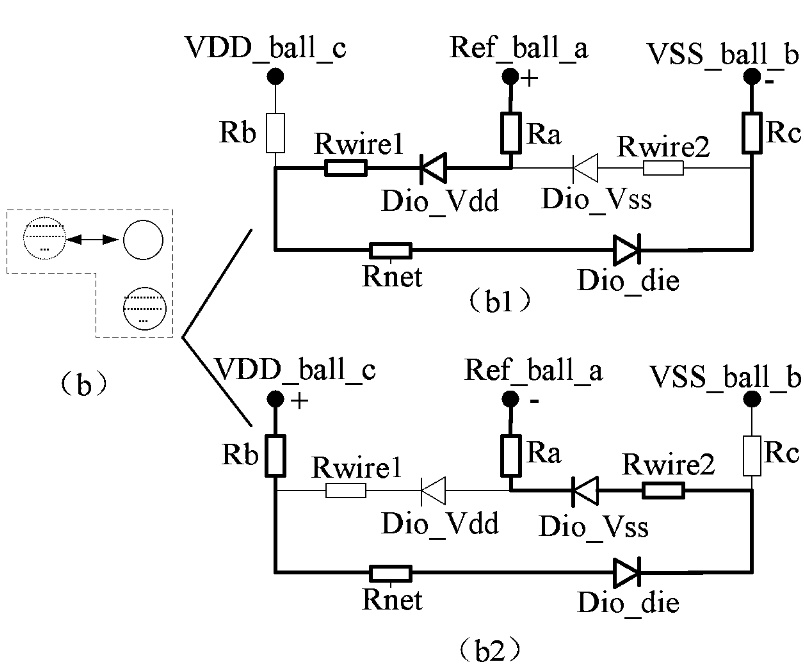
FIG. 9 is an equivalent circuit diagram II of a physical structure of a circuit for acquiring a resistance value of a resistor according to the embodiments of the present disclosure.
Figure 10:
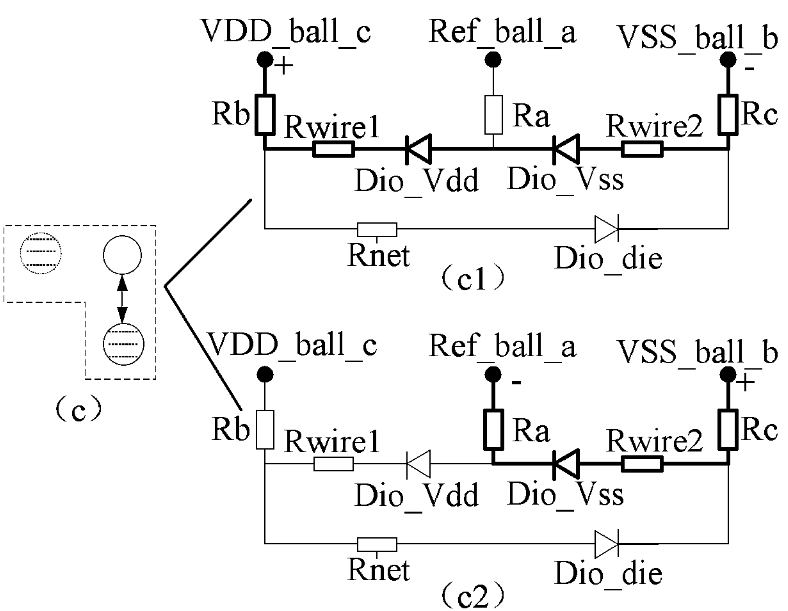
FIG. 10 is an equivalent circuit diagram III of a physical structure of a circuit for acquiring a resistance value of a resistor according to the embodiments of the present disclosure.

To solve for the various resistor components in the equivalent circuit, two of the three ports Ref_Ball_a, VSS_Ball_b, and VDD_Ball_c (hereinafter referred to as Ball_a, Ball_b, and Ball_c) are selected, and the other port is set in the floating status (as shown in FIG. 8, FIG. 9, and FIG. 10). Meanwhile, voltage polarities applied to the two ports are considered, so that a total of six non-repeating branches may be obtained. Each branch at least includes one diode (as shown in FIG. 8 to FIG. 10). Six different equations are obtained by applying the Kirchhoff's current law and considering the unidirectional conductivity of the diode, as described in formulas (1) to (6):

$$R_a + R_b + R_{wire1} = R_{ab} \tag{1}$$

$$R_a + R_b + R_{net} + R_{wire2} = R_{ba} \tag{2}$$

$$R_b + R_c + R_{net} = R_{bc} \tag{3}$$

$$R_b + R_c + R_{wire1} + R_{wire2} = R_{cb} \tag{4}$$

$$R_a + R_c + R_{net} + R_{wire1} = R_{ac} \tag{5}$$

$$R_a + R_c + R_{wire2} = R_{ca} \tag{6}$$

Where $R_a$ corresponds to Ra mentioned above; $R_b$ corresponds to Rb mentioned above; $R_c$ corresponds to Rc mentioned above; $R_{wire1}$ corresponds to $R_{wire1}$ mentioned above; $R_{wire2}$ corresponds to Rwire2 mentioned above; and $R_{net}$ corresponds to Rnet mentioned above.

Due to the fact that a coefficient matrix A of the above linear equation set Ax=b is a singular matrix, namely, $$|A| = \begin{vmatrix} 110010 \\ 110101 \\ 011100 \\ 101110 \\ 101001 \end{vmatrix} = 0$$

Since the above linear equation set does not have a definite solution, an additional equation or constraint condition needs to be added. However, expressions of Rnet, Rwire1, and Rwire2 can be obtained by simple equation operations. The equations are subtracted in pairs, namely, equation (2)-equation (1), equation (4)-equation (3), and equation (6)-equation (5), to obtain equations (7), (8), and (9):

$$R_{net} + R_{wire2} - R_{wire1} = R_{ba} - R_{ab} \tag{7}$$

$$R_{wire1} + R_{wire2} - R_{net} = R_{cb} - R_{bc} \tag{8}$$

$$R_{net} + R_{wire1} - R_{wire2} = R_{ac} - R_{ca} \tag{9}$$

According to (7)+ (8), (8)+ (9), (7)+(9), equations (10), (11), and (12) are obtained:

$$R_{wire2} = (R_{ba} - R_{ab} + R_{cb} - R_{bc})/2 \tag{10}$$

$$R_{wire1} = (R_{cb} - R_{bc} + R_{ac} - R_{ca})/2 \tag{11}$$

$$R_{net} = (R_{ba} - R_{ab} + R_{ac} - R_{ca})/2 \tag{12}$$

Figure 11:
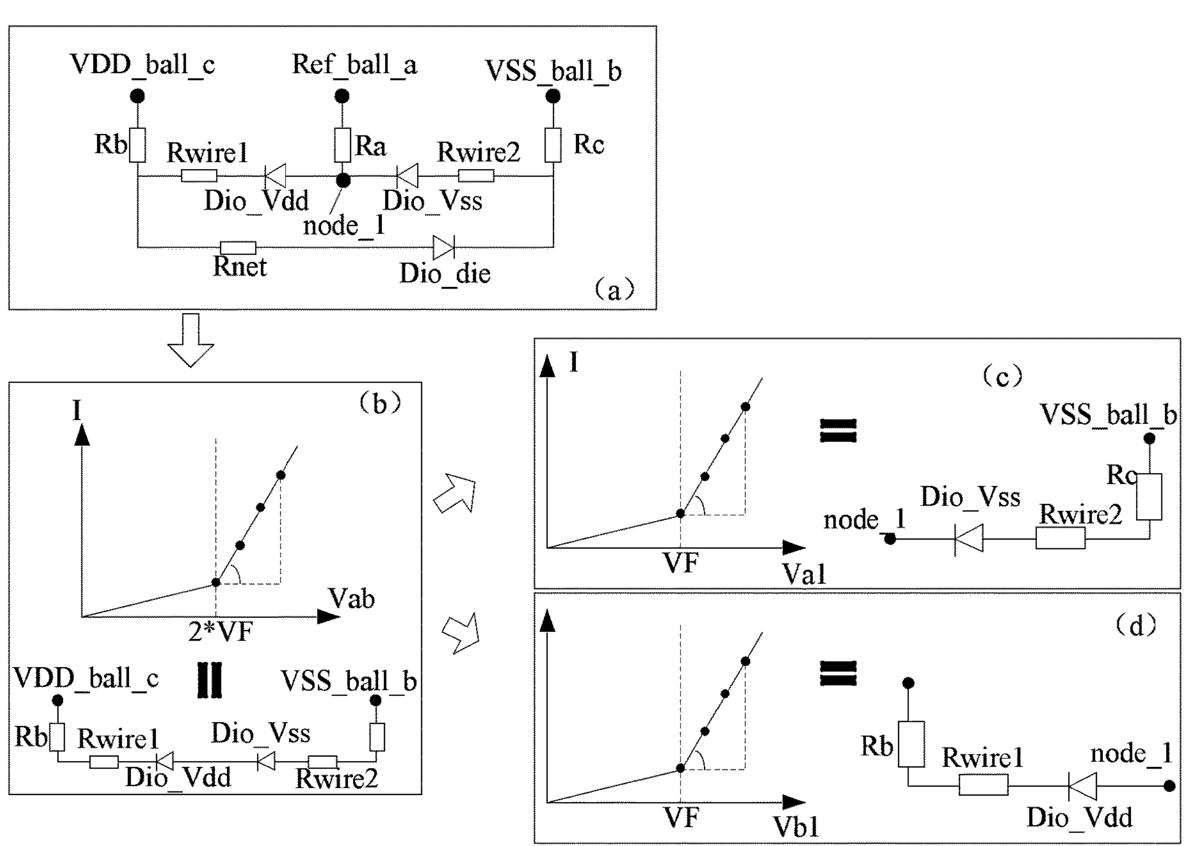
FIG. 11 is an equivalent circuit diagram of voltage polarities applied on different ports of a circuit for acquiring a resistance value of a resistor according to the embodiments of the present disclosure.

FIG. 11 is an equivalent circuit diagram of voltage polarities applied on different ports of a circuit for acquiring a resistance value of a resistor according to the embodiments of the present disclosure. As shown in FIG. 11, considering that Reference Ball is a floating node (assuming that the node is marked as node-1), when the voltage between port Ball_b and port Ball_c changes, voltage collection between port Ball_b and intermediate node-1 and between intermediate node-1 and port Ball_c may be achieved by measuring the voltage of node-1. IV characteristic curves between port Ball_b and intermediate node-1 and between intermediate node-1 and port Ball_c are respectively as shown in FIG. 11(*c*) and FIG. 11(*d*). Through the aforementioned method, general series resistors Rc1 and R1*b* between the nodes may be represented by formulas (13) and (14):

$$R_c + R_{wire1} = R_{c1} \tag{13}$$

$$R_b + R_{wire2} = R_{1b} \tag{14}$$

If formulas (11) and (10) are respectively substituted into formulas (13) and (14), there are:

$$R_c = R_{c1} - (R_{cb} - R_{bc} + R_{ac} - R_{ca})/2 \tag{15}$$

$$R_b = R_{1b} - (R_{ba} - R_{ab} + R_{cb} - R_{bc})/2 \tag{16}$$

Equations (11) and (16) are substituted into equation (1) to obtain equation (17):

$$R_a = R_{ab} - R_b - R_{wire1} = R_{ab} - [R_{1b} - (R_{ba} - R_{ab} + R_{cb} - R_{bc})/2] - (R_{cb} - R_{bc} + R_{ac} - R_{ca})/2 \tag{17}$$

Therefore, all the resistors in the equivalent circuit of FIG. 2 can be solved using formulas (10) to (12) and (15) to (17).

Figure 12:
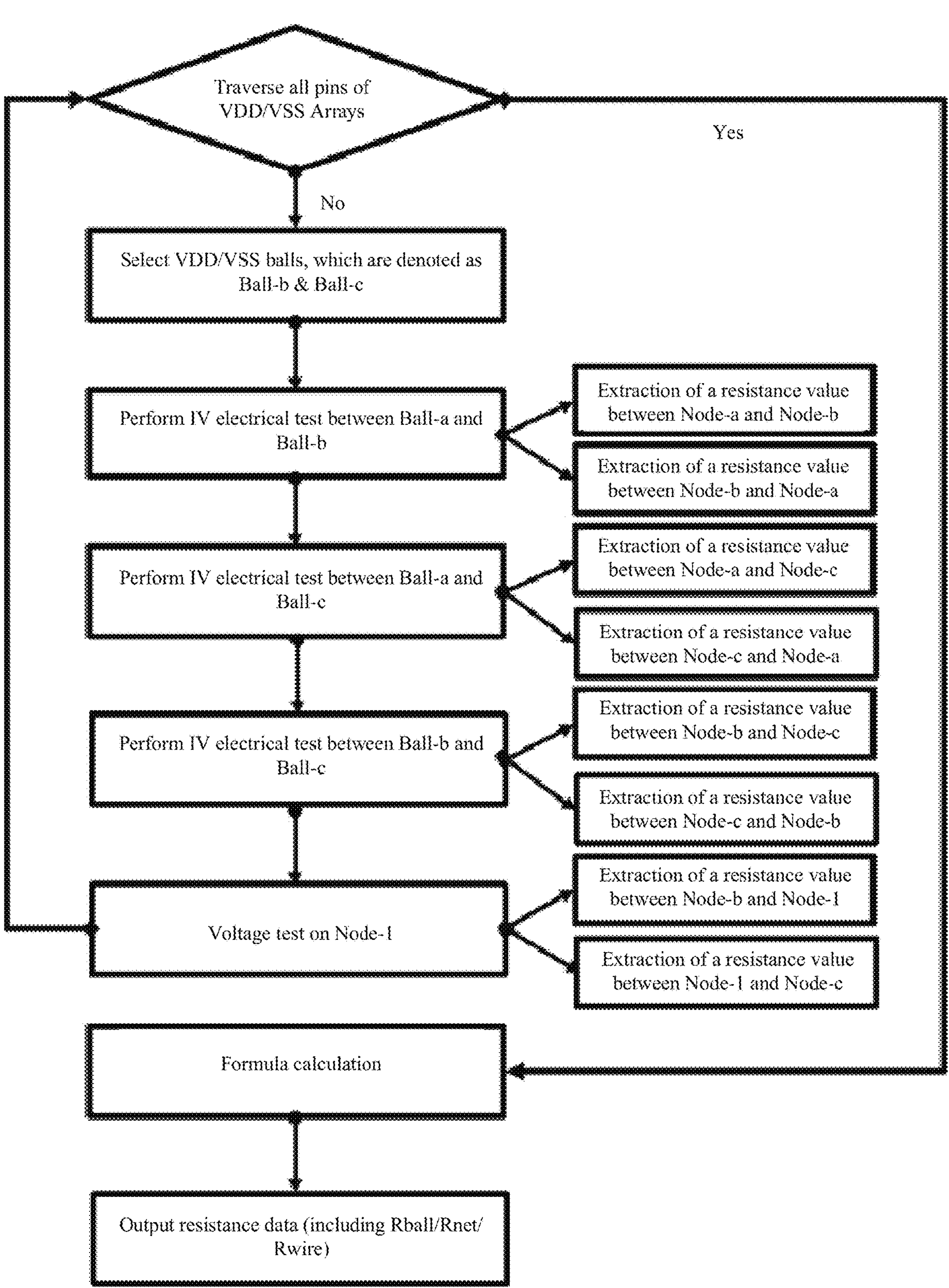
FIG. 12 is a flowchart of test on resistances of various parts for acquisition of a resistance value of a resistor according to the embodiments of the present disclosure.

The embodiments of the present disclosure provide a resistor extraction process of a hybrid test circuit. FIG. 12 is a flowchart of test on resistances of various parts for acquisition of a resistance value of a resistor according to the embodiments of the present disclosure. As shown in FIG. 12, operations of a measurement operation involved are described below.

A. Iteration condition: A ball is selected from the VDD/VSS Ball Array each time until the balls in all Arrays are traversed.

B. Port selection: It is assumed that the selected VDD and VSS pins (namely, the ball selected from A) are simply denoted Ball_b and Ball_c. Reference_Ball is a fixed test pin, denoted as Ball_a.

C. Voltage setting: Voltages with opposite positive and negative characteristics are respectively applied to every pair of pins: One voltage is VDD; the other voltage is VSS; and the remaining pin is in floating.

D. IV characteristic measurement: IV curves of two selected pins under opposite polarities are measured, and all pin combinations are traversed. The aforementioned resistor extraction method is repeatedly used to perform linear fitting on the RS-domained Region data to obtain total resistances Rab, Rba, Rac, Rca, Rbc, and Rcb between different ports, respectively corresponding to the aforementioned $R_{ab}$, $R_{ba}$, $R_{ac}$, $R_{ca}$, $R_{bc}$, $R_{cb}$.

E. Intermediate node voltage measurement: During the measure of Ball-a and Ball_c, a voltage value of node-1 is recorded, and the aforementioned resistor extraction method is repeated to obtain Rc1 and R1*b*.

F. Test cycle: The test cycle is performed according to the iteration condition in operation A to repeat operations B to E until all the balls in the VDD/VSS Ball Array are traversed.

G. Circuit analysis and calculation: All the resistors in the equivalent circuit of FIG. 2 may be solved using the above formulas (10) to (12) and (15) to (17).

Figure 13:
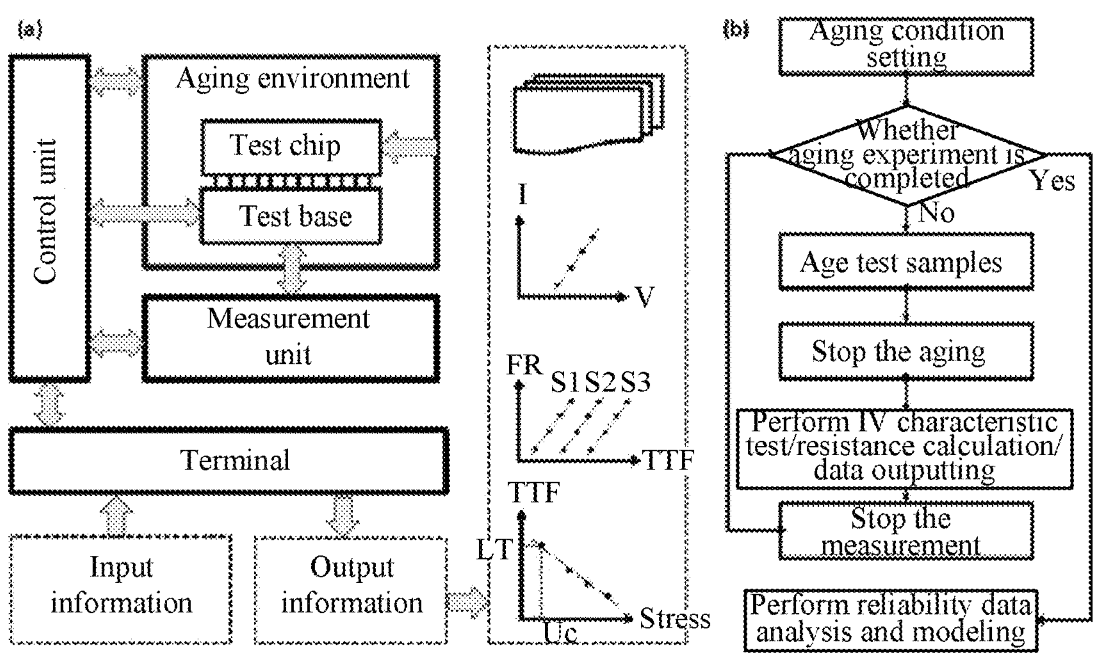
FIG. 13 is a flowchart of reliability test on resistances of various parts for acquisition of a resistance value of a resistor according to the embodiments of the present disclosure.

The embodiments of the present disclosure further provide a circuit for acquiring a resistance of a resistor based on a resistor/diode. FIG. 13 is a flowchart of reliability test on resistances of various parts for acquisition of a resistance value of a resistor according to the embodiments of the present disclosure. FIG. 13(*a*) and FIG. 13(*b*) respectively show a schematic diagram and a flow of the design of the reliability test on the circuit.

A. The design of the reliability test includes:

a) Hardware composition: As shown in FIG. 13(*a*), the hardware supporting the design of the reliability test of the embodiments of the present disclosure includes an aging test device (for example, with Aging Condition), a control unit, a measurement unit, and terminals.

b) The aging test device exerts a stress required by the reliability test. The aging test device further internally includes a test chip (namely, includes a test sample of the resistor/diode hybrid test circuit) and a test socket (which achieves electrical connection between the test chip and the measurement unit as well as the aging test device.

c) The measurement unit achieves IV measurement of the resistor/diode hybrid test circuit.

d) The terminal achieves inputting of an experimental condition, conversion of it into an executable machine instruction, as well as experimental data collection, processing, and visual outputting. Contents input by the terminal include: a type and size of the stress of the reliability test, aging time, failure criteria of the test sample, an IV test program, and an equation solver. Contents output by the terminal include: a source file of resistance measurement data, reliability distribution and fitting, creation of aging model parameters, and life estimation.

e) The control unit achieves transmission of instructions sent by the terminal and signal feedback.

f) Connection relationship:

i. The terminal is connected to the control unit and communicates with the aging test device and the measurement unit through the control unit to achieve instrument control in the operations of the test operation.

ii. The control unit is interconnected to the terminal, the measurement unit, and the aging test device to achieve instruction control performed by the terminal on the aging test device and the measurement unit, as well as to collect test data generated by the measurement unit and output the test data to the terminal.

iii. The test socket and the test chip are in direct contact with the balls on the test chip, and loading of electrical signals of the aging test device and the measurement unit is controlled through an internal switch circuit.

B. The flowchart is shown in FIG. 13(*b*), and the flow of the reliability test includes:

a) Test is set at the terminal.

b) A cycle criterion is whether all preset aging reading points have been completed. If not, a cyclic test of “aging-testing” is performed; and if so, the cycle ends.

c) The aging test device exerts a stress with a preset duration and a preset strength to the test chip.

d) The stress application of the aging test device is stopped.

e) The measurement unit performs (circuit and voltage) IV testing on the test chip, calculates a series resistance, and outputs data. This operation is the same as the test flow in FIG. 12.

f) The test on the measurement system is stopped.

g) Operations (c) to (f) are repeated until operation (b) determines that all the aging reading points end.

h) The terminal performs reliability analysis and modeling on the experimental data, and outputs an expected life value.

In an implementation, the circuit module part in the embodiments of the present disclosure includes: a resistor network, including all BGA Balls and C4 Bumps, as well as interconnects in the system, all of which are abstracted as individual lumped resistors; diodes, including discrete diodes between the Reference Ball and the VDD/VSS Ball Array, as well as integrated diodes between the Bump Arrays.

According to the descriptions in the foregoing implementations, a person having ordinary skill in the art may clearly learn that the method according to the foregoing embodiments may be implemented by relying on software and an essential commodity hardware platform or by using hardware, but the former is a better implementation in most cases. Based on such an understanding, the technical solutions of the embodiments of the present disclosure essentially, or the part contributing to the existing technology, may be presented in the form of a software product. The computer software product is stored in a storage medium (for example, a read-only memory (ROM)/random access memory (RAM), a magnetic disk, or an optical disk) including several instructions to enable a terminal device (which may be a mobile phone, a computer, a server, a network device, or the like) to perform the methods described in all the embodiments of the present disclosure.

This embodiment further provides an apparatus for acquiring a resistance value of a resistor. The apparatus is configured to implement the above embodiments and exemplary implementations. Those contents that have been described will not be elaborated. As used below, the term “module” may be a combination of software and/or hardware that implements a predetermined function. Although the apparatus described in the following embodiments is preferably implemented in software, the implementation of hardware or a combination of software and hardware is also possible and envisioned.

Figure 14:
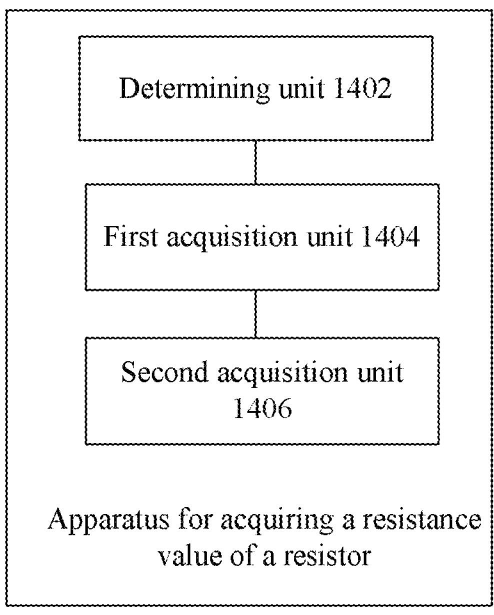
FIG. 14 is a schematic structural diagram of an apparatus for acquiring a resistance value of a resistor according to the embodiments of the present disclosure.

FIG. 14 is a schematic structural diagram of an apparatus for acquiring a resistance value of a resistor according to the embodiments of the present disclosure. As shown in FIG. 14, the apparatus includes:

a determining unit 142, configured to determine nodes based on multiple resistors in an equivalent circuit to be tested, and select any two nodes as a node combination, wherein the multiple resistors at least include a working voltage node resistor Rb, a common ground voltage node resistor Rc, and a reference node resistor Ra;

the equivalent circuit to be tested may further include: a first interconnect parasitic resistor Rwire1, a second interconnect parasitic resistor Rwire2, an encapsulation network resistor Rnet, a first diode Dio_VDD, a second diode Dio_Vss, and a third diode Dio_die, wherein the working voltage node resistor Rb is respectively connected to one end of the first interconnect parasitic resistor Rwire1 and one end of the encapsulation network resistor Rnet; the other end of the first interconnect parasitic resistor Rwire1 is connected to a negative electrode of the first diode Dio_VDD, and a positive electrode of the first diode Dio_VDD is respectively connected to the reference node resistor Ra and a negative electrode of the second diode Dio_Vss; a positive electrode of the second diode Dio_VSS is respectively connected to the common ground voltage node resistor Rc and a negative electrode of the third diode Dio_die via the second interconnect parasitic resistor Rwire2; a positive electrode of the third diode Dio_die is connected to the other end of the encapsulation network resistor Rnet;

a first acquisition unit 144, configured to apply different voltage polarities to the node combination for voltage and current characteristic detection, and acquire a series resistance value between two ends of the node combination under each voltage polarity combination; and a second acquisition unit 146, configured to acquire resistance values of the multiple resistors in the equivalent circuit to be tested based on the series resistance value.

According to the technical solutions of the embodiments of the present disclosure, the circuit for acquiring the resistance value of the resistor provided in the embodiments of the present disclosure is embedded into a target system, so that separation and extraction of resistors of various components of the system are achieved by testing and analyzing IV characteristics of all end points of the system, and the resistors of the various components of the system may be monitored more precisely. The life of a specific component in the system is predicted by observing changes in the resistance values in the aging process.

In an embodiment, the apparatus may further include:

an execution module, configured to, when it is detected that all aging reading points of a preset circuit to be tested have not been fully detected, perform the following operations:

exerting, by an aging test device, a stress with a preset duration and a preset strength to a die to be tested;

when the preset duration reaches a first threshold or the preset strength reaches a second threshold, stopping, by the aging test device, exerting the stress;

testing the die to be tested, and calculating resistance values of series resistors; and determining an expected life value of the die to be tested based on the calculated resistance values of the series resistors.

In an embodiment, the working voltage node resistor Rb is a first array resistor composed of multiple resistors connected in parallel to each other.

In an embodiment, the common ground voltage node resistor Rc is a second array resistor composed of multiple resistors connected in parallel to each other.

In an embodiment, the working voltage node resistor Rb is connected to one end of the first interconnect parasitic resistor Rwire1 and one end of the encapsulation network resistor Rnet through at least one diode.

In an embodiment, the reference node resistor Ra includes at least one third array resistor, wherein each third array resister is composed of multiple resistors connected in parallel to each other.

In an embodiment, the reference node resistor Ra includes multiple third array resistors, and a diode is connected between every two third array resistors.

In an embodiment, the working voltage node resistor Rb, the common ground voltage node resistor Rc, and the reference node resistor $R_a$ are all bumps on a circuit substrate.

It should be noted that the above modules may be implemented through software or hardware. For the latter, the various modules may be implemented in the following ways, but not limited to: The above modules are all located in the same processor; or, the aforementioned modules may be located in different processors in the form of any combination.

The embodiments of the present disclosure further provide a computer-readable storage medium. The computer-readable storage medium stores a computer program. The computer program is configured to perform the operations in any one of the method embodiments at runtime.

In an exemplary embodiment, the computer-readable storage medium mentioned above may include but not limited to: various media that may store computer programs, such as a USB flash drive, a Read-Only Memory (ROM), a Random Access Memory (RAM), a mobile hard disk drive, a magnetic disk, and an optical disk.

The embodiments of the present disclosure further provide an electronic apparatus, including a memory and/or a processor. The memory stores a computer program. The processor is configured to run the computer program to perform the operations in any one of the method embodiments.

In an exemplary embodiment, the aforementioned electronic apparatus may further include a transmission device and an input/output device, wherein the transmission device is connected to the above processor, and the input/output device is connected to the above processor.

The specific examples in this embodiment may refer to the examples described in the above embodiments and exemplary implementations, and will not be elaborated in this embodiment.

Obviously, those having ordinary skill in the art should understand that the various modules or operations of the embodiments of the present disclosure may be implemented using a universal computing apparatus, which may be concentrated on a single computing apparatus or distributed on a network composed of multiple computing apparatuses. The modules or operations may be implemented using program codes that may be executed by a computing apparatus, so that the modules or operations may be stored in a storage apparatus for execution by the computing apparatus. Furthermore, in some cases, the operations shown or described may be executed in an order different from those here, or the operations may be separately made into various integrated circuit modules, or multiple modules or operations among the modules or operations may be made into single integrated circuit modules for implementation. In this way, the present disclosure is not limited to any specific combinations of hardware and software.

The above descriptions are only exemplary embodiments of the present disclosure, and are not intended to limit the present disclosure. Those having ordinary skill in the art may make various changes and transformations on the embodiments of the present disclosure. Any modification, equivalent replacement, and improvement made within the principle of the present disclosure shall fall within the protection scope of the present disclosure.

What is claimed is:

1. A circuit comprising: a working voltage node resistor Rb, a common ground voltage node resistor Rc, a reference node resistor Ra, a first interconnect parasitic resistor Rwire1, a second interconnect parasitic resistor Rwire2, an encapsulation network resistor Rnet, a first diode Dio_VDD, a second diode Dio_Vss, and a third diode Dio_die, wherein the working voltage node resistor Rb is respectively connected to one end of the first interconnect parasitic resistor Rwire1 and one end of the encapsulation network resistor Rnet; the other end of the first interconnect parasitic resistor Rwire1 is connected to a negative electrode of the first diode Dio_VDD, and a positive electrode of the first diode Dio_VDD is respectively connected to the reference node resistor Ra and a negative electrode of the second diode Dio_Vss; a positive electrode of the second diode Dio_VSS is respectively connected to the common ground voltage node resistor Rc and a negative electrode of the third diode Dio_die via the second interconnect parasitic resistor Rwire2; and a positive electrode of the third diode Dio_die is connected to the other end of the encapsulation network resistor Rnet.

2. The circuit according to claim 1, wherein the working voltage node resistor Rb is a first array resistor composed of multiple resistors connected in parallel to each other.

3. The circuit according to claim 1, wherein the common ground voltage node resistor Rc is a second array resistor composed of multiple resistors connected in parallel to each other.

4. The circuit according to claim 1, wherein the working voltage node resistor Rb is connected to one end of the first interconnect parasitic resistor Rwire1 and one end of the encapsulation network resistor Rnet through at least one diode.

5. The circuit according to claim 1, wherein the reference node resistor Ra comprises a third array resistor, wherein the third array resistor is composed of multiple resistors connected in parallel to each other.

6. The circuit according to claim 1, wherein the working voltage node resistor Rb, the common ground voltage node resistor Rc, and the reference node resistor Ra are all bumps on a circuit substrate.

7. The circuit according to claim 1, wherein the positive electrode of the second diode Dio_Vss is connected to one end of the second interconnect parasitic resistor Rwire2, and the other end of the second interconnect parasitic resistor Rwire2 is respectively connected to the common ground voltage node resistor Rc and a negative electrode of the third diode Dio_die.

8. A resistance value acquisition method based on a circuit comprising a working voltage node resistor Rb, a common ground voltage node resistor Rc, a reference node resistor Ra, a first interconnect parasitic resistor Rwire1, a second interconnect parasitic resistor Rwire2, an encapsulation network resistor Rnet, a first diode Dio_VDD, a second diode Dio_Vss, and a third diode Dio_die, wherein the working voltage node resistor Rb is respectively connected to one end of the first interconnect parasitic resistor Rwire1 and one end of the encapsulation network resistor Rnet; the other end of the first interconnect parasitic resistor Rwire1 is connected to a negative electrode of the first diode Dio_VDD, and a positive electrode of the first diode Dio_VDD is respectively connected to the reference node resistor Ra and a negative electrode of the second diode Dio_Vss; a positive electrode of the second diode Dio_VSS is respectively connected to the common ground voltage node resistor Rc and a negative electrode of the third diode Dio_die via the second interconnect parasitic resistor Rwire2; and a positive electrode of the third diode Dio_die is connected to the other end of the encapsulation network resistor Rnet, the method comprising:

determining nodes based on multiple resistors in the circuit, and selecting any two nodes as a node combination, wherein the multiple resistors at least comprise the working voltage node resistor Rb, the common ground voltage node resistor Rc, and the reference node resistor Ra;

applying different voltage polarities between the two nodes of the node combination to perform voltage and current characteristic detection, and acquiring a series resistance value between the two nodes of the node combination under each of the different voltage polarities; and acquiring resistance values of the multiple resistors in the circuit based on the series resistance value.

9. The method according to claim 8, wherein the third diode Dio_die is an integrated diode on a Si Die, and the method further comprises:

exerting a stress with a preset duration and a preset strength to the Si Die;

when the preset duration reaches a first threshold or the preset strength reaches a second threshold, stopping exerting the stress;

testing the Si Die, and calculating the resistance values of the multiple resistors; and determining an expected life value of the Si Die based on the calculated resistance values of the multiple resistors.

10. The method according to claim 8, wherein the working voltage node resistor Rb is a first array resistor composed of multiple resistors connected in parallel to each other.

11. The method according to claim 8, wherein the common ground voltage node resistor Rc is a second array resistor composed of multiple resistors connected in parallel to each other.

12. The method according to claim 8, wherein the working voltage node resistor Rb is connected to one end of the first interconnect parasitic resistor Rwire1 and one end of the encapsulation network resistor Rnet through at least one diode.

13. The method according to claim 8, wherein the reference node resistor Ra comprises a third array resistor, wherein the third array resistor is composed of multiple resistors connected in parallel to each other.

14. The method according to claim 8, wherein the working voltage node resistor Rb, the common ground voltage node resistor Rc, and the reference node resistor Ra are all bumps on a circuit substrate.

15. The method according to claim 8, wherein the positive electrode of the second diode Dio_Vss is connected to one end of the second interconnect parasitic resistor Rwire2, and the other end of the second interconnect parasitic resistor Rwire2 is respectively connected to the common ground voltage node resistor Rc and a negative electrode of the third diode Dio_die.

16. A non-transitory computer-readable storage medium storing a computer program, wherein the computer program is configured to perform, at runtime, the operations in the method according to claim 8.

17. A resistance value acquisition apparatus based on a circuit comprising a working voltage node resistor Rb, a common ground voltage node resistor Rc, a reference node resistor Ra, a first interconnect parasitic resistor Rwire1, a second interconnect parasitic resistor Rwire2, an encapsulation network resistor Rnet, a first diode Dio_VDD, a second diode Dio_Vss, and a third diode Dio_die, wherein the working voltage node resistor Rb is respectively connected to one end of the first interconnect parasitic resistor Rwire1 and one end of the encapsulation network resistor Rnet; the other end of the first interconnect parasitic resistor Rwire1 is connected to a negative electrode of the first diode Dio_VDD, and a positive electrode of the first diode Dio_VDD is respectively connected to the reference node resistor Ra and a negative electrode of the second diode Dio_Vss; a positive electrode of the second diode Dio_VSS is respectively connected to the common ground voltage node resistor Rc and a negative electrode of the third diode Dio_die via the second interconnect parasitic resistor Rwire2; and a positive electrode of the third diode Dio_die is connected to the other end of the encapsulation network resistor Rnet, the apparatus comprising a memory storing instructions and a processor in communication with the memory, wherein the processor is configured to execute the instructions to:

determine nodes based on multiple resistors in the circuit, and select any two nodes as a node combination, wherein the multiple resistors at least comprise the working voltage node resistor Rb, the common ground voltage node resistor Rc, and the reference node resistor Ra;

apply different voltage polarities between the two nodes of the node combination to perform voltage and current characteristic detection, and acquire a series resistance value between the two nodes of the node combination under each of the different voltage polarities; and acquire resistance values of the multiple resistors in the circuit based on the series resistance value.

18. The apparatus according to claim 17, wherein the third diode Dio_die is an integrated diode on a Si Die, and the processor is further configured to execute the instructions to:

exert a stress with a preset duration and a preset strength to the Si Die;

when the preset duration reaches a first threshold or the preset strength reaches a second threshold, stopping exerting the stress;

testing the Si Die, and calculating the resistance values of the multiple resistors; and determining an expected life value of the Si Die based on the calculated resistance values of the multiple resistors.

* * * * *